United States Patent [19]

Matsuoka

[11] Patent Number: 5,035,629
[45] Date of Patent: Jul. 30, 1991

[54] ELECTRICAL CONNECTOR

[75] Inventor: Noriyuki Matsuoka, Tokyo, Japan

[73] Assignee: Yamaichi Electric Manufacturing Co., Ltd., Tokyo, Japan

[21] Appl. No.: 547,999

[22] Filed: Jul. 3, 1990

[30] Foreign Application Priority Data

Jul. 4, 1989 [JP] Japan .................................. 1-172691

[51] Int. Cl.$^5$ ............................................... H01R 9/09
[52] U.S. Cl. ........................................ 439/70; 439/72; 439/862
[58] Field of Search ...................... 439/70, 72, 73, 76, 439/81, 84, 606, 862

[56] References Cited

U.S. PATENT DOCUMENTS

| | | | |
|---|---|---|---|
| 3,470,522 | 9/1969 | Lawrence | 439/862 |
| 4,547,028 | 10/1985 | Morgan et al. | 439/70 |
| 4,583,806 | 4/1986 | Tainter, Jr. et al. | 439/72 |
| 4,941,832 | 7/1990 | Korsunsky et al. | 439/72 |

FOREIGN PATENT DOCUMENTS

| | | |
|---|---|---|
| 57-21081 | 2/1982 | Japan . |
| 63-117084 | 7/1988 | Japan . |
| 63-164191 | 10/1988 | Japan . |
| 1281535 | 7/1972 | United Kingdom ................ 439/862 |

*Primary Examiner*—Paula A. Bradley
*Attorney, Agent, or Firm*—Wenderoth, Lind & Ponack

[57] ABSTRACT

A contact has a contact nose adapted to contact a terminal of an electric part, and a resilient supporting element adapted to elastically support the contact nose. The nose and supporting element are continuously formed with a predetermined angle defined therebetween such that a continuously formed portion between the nose and supporting element serves as a pressure contact portion for contacting with a conductive member of another electric part under pressure. The supporting element is displaced with the pressure contact portion serving as a supporting point and the contact nose is resiliently displaced.

4 Claims, 3 Drawing Sheets

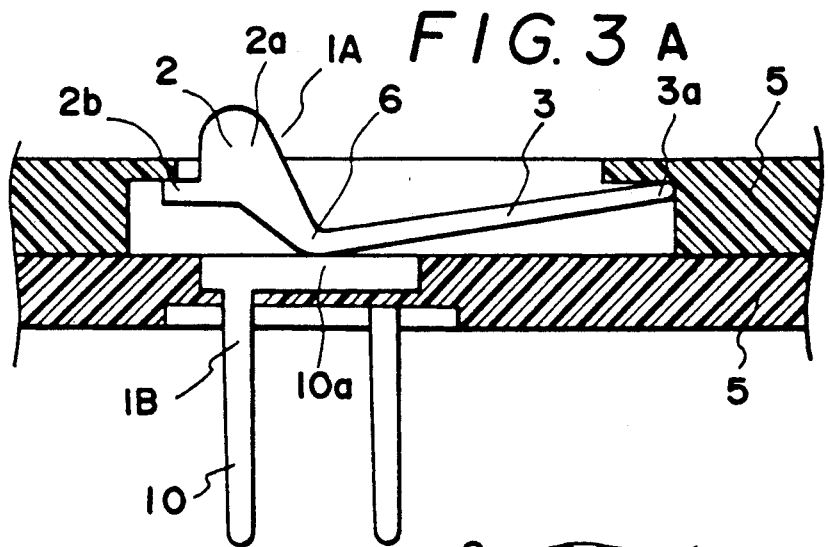
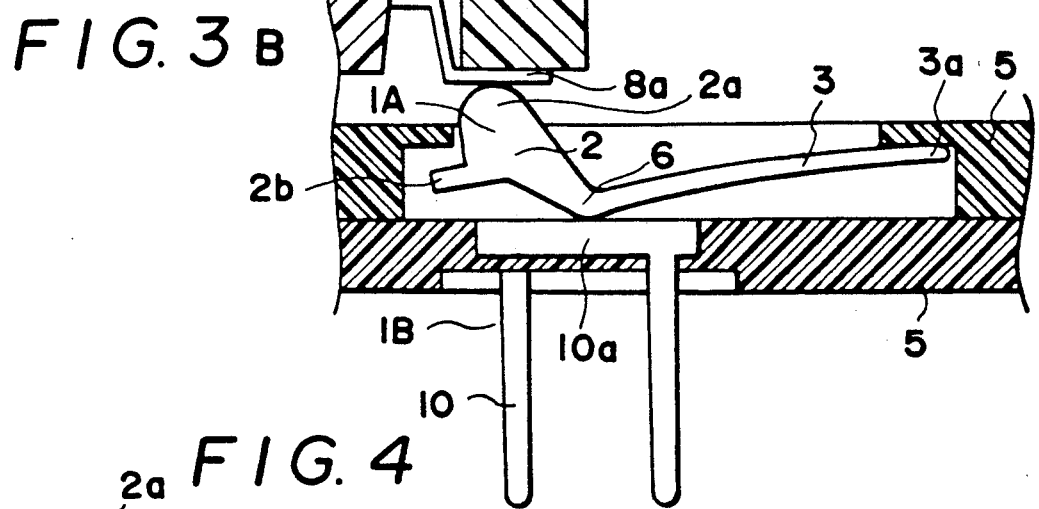
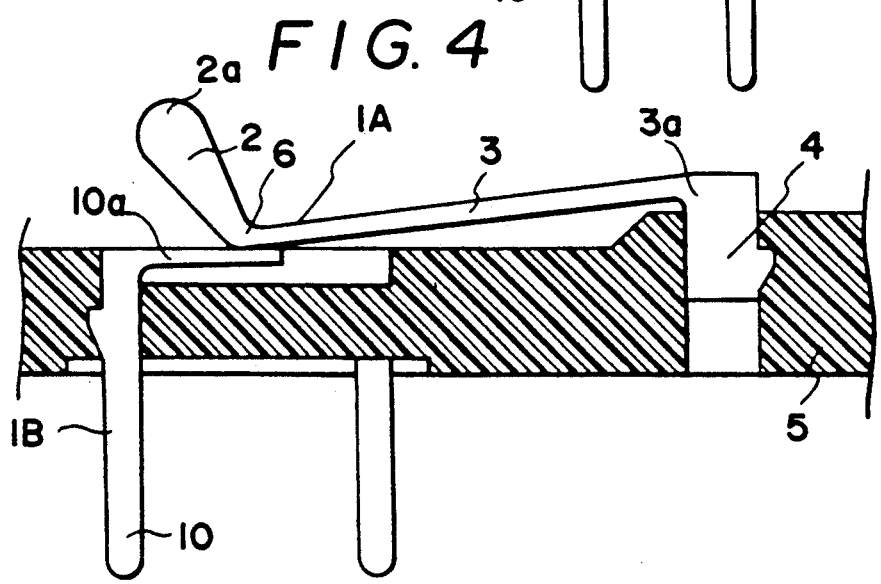

ELECTRICAL CONNECTOR

BACKGROUND OF THE INVENTION

1. Field of the Invention

This invention relates to an electrical connector for connecting an electric part such as an IC package, etc. and more particularly to a socket which is suitable for transmitting an electric signal of high frequency.

2. Brief Description of the Prior Art

A connector disclosed in Japanese Utility Model Laid-Open Publication No. Sho 63-117084 has a bypass bending element having a contact nose at one end portion thereof and which contact nose is displaced downwardly. The contact nose is abutted against a projecting element on the side of a male terminal disposed at the other end portion of the bypass bending portion so as to resiliently displace the projecting element against its biasing force, thereby to provide a bypass through the contact nose.

Another prior art connector disclosed in Japanese Laid-Open Publication No. Sho 57-21081 has a contact nose which is resiliently displaced such that a short piece extending from the contact nose side is slid to contact a spring element, thereby to provide a bypass through the contact nose.

Another prior art contact disclosed in Japanese Utility Model Laid-Open Publication No. Sho 63-164191 adopts a projecting element projecting toward a contact nose side from a male terminal side which does not possess an elastic property, and an inclined surface is defined by an inner surface of the projecting element and by an inner surface of the contact nose, so that when the contact nose is displaced downwardly, the inclined surface of the contact nose is abutted against the inclined surface of the projecting element and thereafter displaced backwardly along the inclined surface to generate a pushing force on the contact nose and projecting element, thereby to provide a bypass through the contact nose.

In the conventional connectors of this type, as they necessarily possess various tolerances such as dimensional tolerances of the contact nose of the counterpart electric part, dimensional tolerances of contacts, socket boards, etc., and the displacing amount of the bypass bending element is irregular. However, in the Japanese Utility Model Laid-Open Publication No. Sho 63-117084 and Japanese Patent Laid-Open Publication No. Sho 63-164191, the amount of displacement of the bypass bending portion is absorbed by resiliently displacing the bypass bending element upwardly, downwardly and backwardly.

However, in Japanese Utility Model Laid-Open Publication No. Sho 63-117084 and Japanese Patent Laid-Open Publication No. Sho 57-21081, because the bypass element is warped in order to render a spring property thereto, the distance of the bypass through the contact nose and the male terminal is not the shortest. In the latter case, the bypassing distance becomes merely slightly short depending on the extent of irregularities in the amount of displacement of the bypass bending element. In addition, as the pushing force to the contact nose owing to the resiliency of the bypass element jeopardizes a smooth displacement of the bypass element, it is required to strictly adjust the resiliency of the bypass element and that of the bypass bending element, whereby production becomes difficult.

Furthermore, in the connector disclosed in Japanese Utility Model Laid-Open Publication No. Sho 63-164191, it is required to generate a contacting force between the contact element of an electric part and the contact nose of the contact as well as a contacting force between the contact nose and a projecting element by upward, downward and backward displacement of the bypass bending element. Moreover, both of the contacting forces are effected by different directions of resiliency of the bypass bending element. Accordingly, designing the bypass bending element is very difficult and an excessive load is applied to the bypass bending element, thus resulting in a short mechanical life of the bypass bending element.

The present invention has been accomplished in order to obviate these shortcomings.

SUMMARY OF THE INVENTION

As means for solving the above-mentioned problems, a contact according to the present invention includes a contact nose adapted to contact a terminal of an electric part, and a resilient supporting element adapted to resiliently support the contact nose, the nose and supporting element being continuously formed with a predetermined angle defined therebetween. A portion of the contact between the nose and supporting element serves as a pressure contact portion for contacting a conductive member of another electric part under pressure. The supporting element is displaced with the pressure contact portion serving as a supporting point and the contact nose being resiliently displaced. The contact nose may be a rigid member.

Also, according to a different aspect of the invention, there is provided a contact including a contact nose adapted to contact a terminal of an electric part, and a resilient supporting element adapted to resiliently support the contact nose, the nose and supporting element being continuously formed with a predetermined angle defined therebetween. A portion of the contact between the nose and supporting element serves as a pressure contact portion for contacting with a conductive member of another electric part under pressure. The supporting element is displaced with the pressure contact portion serving as a supporting point and the contact nose being resiliently displaced. The contact nose is formed of a resiliently displaceable contact element. And a stationary contact element is embedded in a connector base and abuts against and supports thereon the displaceable contact nose through the pressure contact portion. Stationary ones of the contact noses may be arranged in a zigzag form, and male terminals of adjacent stationary contact noses may be disposed in positions at equal distances from pressure contact portions.

When pressure is applied to the contact nose when the electric part terminal is placed thereon, the contact nose is displaced downwardly due to a flexing of the resilient supporting element to provide pressure contact with a conductive member and another electric part or a stationary contact element embedded in the connector board. At the same time, while the resilient supporting element is displaced with the pressure contact portion serving as a supporting point, the circuit between the contact nose of the contact and the conductive element or between the stationary contact elements is shorted. As a result, the bypass can be achieved by way of the shortest distance between the electric part mounting contact portion and the pressure contacting portion through the contact nose, that is, by way of the shortest distance through the contact element.

BRIEF DESCRIPTION OF THE DRAWINGS

FIG. 3(A) is a sectional view of a connector having a contact according to a third embodiment of the present invention;

FIG. 3(B) is likewise a sectional view showing an electric part mounted and in contact therewith; and FIG. 4 is a sectional view of a connector having a contact according to a fourth embodiment of the present invention.

DETAILED DESCRIPTION OF THE PREFERRED EMBODIMENTS

One preferred embodiment of the present invention will be described hereinafter with reference to FIGS. 1 through 4 of the accompanying drawings.

Figure 1A:
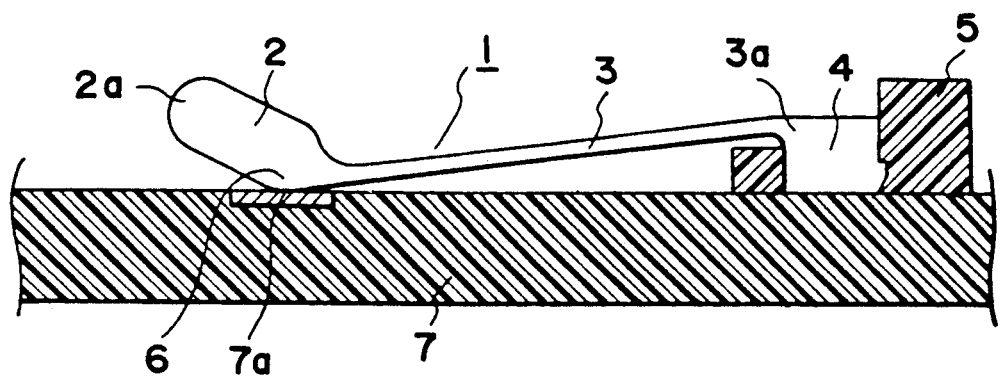
FIG. 1(A) is a sectional view of a connector having a contact according to one embodiment of the present invention, which is mounted on a wiring board.
Figure 1B:
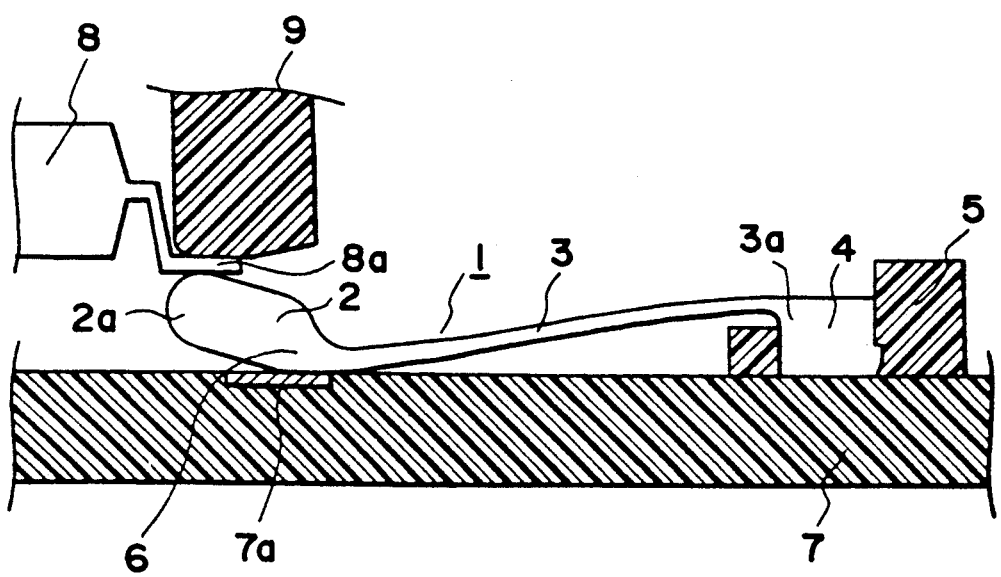
FIG. 1(B) is likewise a sectional view showing an electric part mounted and in contact therewith.

First Embodiment (see FIG. 1)

Reference numeral 1 denotes a contact which is formed of a contact nose 2 and a resilient supporting element 3 for elastically supporting the contact nose 2. The contact nose and the supporting element 3 are continuously formed with each other with a predetermined bending angle defined therebetween such that a bent portion 6 is formed which serves as a pressure contact portion. The free end of the contact nose 2 serves as a seat 2a for a terminal 8a of an electric part 8 such as an IC, etc. to be placed thereon, and a tail end 3a of the supporting element 3 is embedded in a connector base 5 through a fixed portion 4 formed on the tail end 3a. The contact 1 is resiliently displaceable with the bent portion serving as a first supporting point and the tail end 3a as a second supporting point.

The connector base 5 is fixed to a wiring board 7 and the pressure contact portion formed of the bent portion 6 formed between the contact nose 2 and the supporting element 3 abuts against and is supported by a conductive member 7a of the wiring board 7.

When pressure is applied to the terminal 8a of the electric part 8, which is placed on the seat 2a of the contact nose 2 of the contact 1, by a pressure member 9, a displacement force is applied to the resilient supporting element 3 with the bending portion 6 (pressure contact portion) serving as a supporting point. As a result, the supporting element 3 is resiliently flexed to cause the bent portion 6 to contact the conductive member 7a of the wiring board 7 under pressure. At the same time, a restoring force is exerted on the contact nose 2 owing to the supporting element 3 to provide a contact pressure between the electric part terminal 8a and the seat 2a. As a result, the conductive member 7a of the wiring board 7 and the electric part terminal 8a contact each other through the contact nose 2. As a result, the bypass can be achieved along the shortest path through this contact nose 2. That is, there can be obtained a contact which exhibits a favorable characteristics with respect to a signal of high frequency.

Also, when the connector for the electric part is fixed to the wiring board 7, the bent portion 6 (pressure contact portion) interconnecting the contact nose 2 and the elastic supporting element 3 is disposed in such a manner as to correspond to the conductive member 7a of the wiring board 7 either in its contacted state or non-contacted state. It does not necessarily assume its contacted state before it is pressurized by the pressure member 9.

Figure 2:
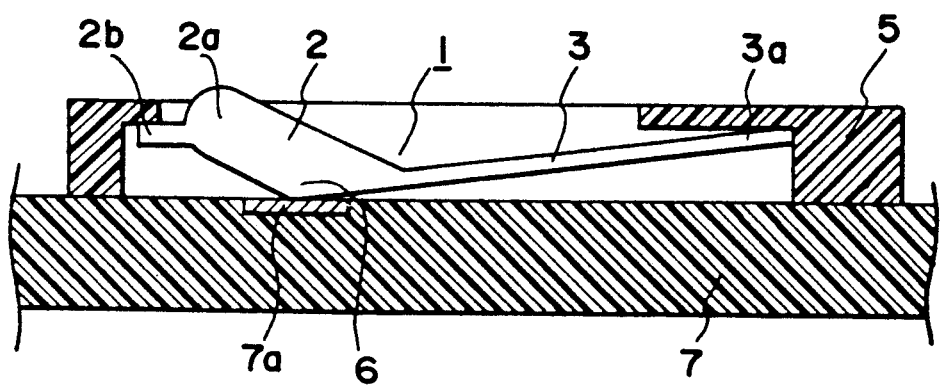
FIG. 2(A) is a sectional view of a connector having a contact according to a second embodiment of the present invention, which is mounted on a wiring board.
FIG. 2(B) is likewise a sectional view showing an electric part mounted and in contact therewith.
Figure 2:
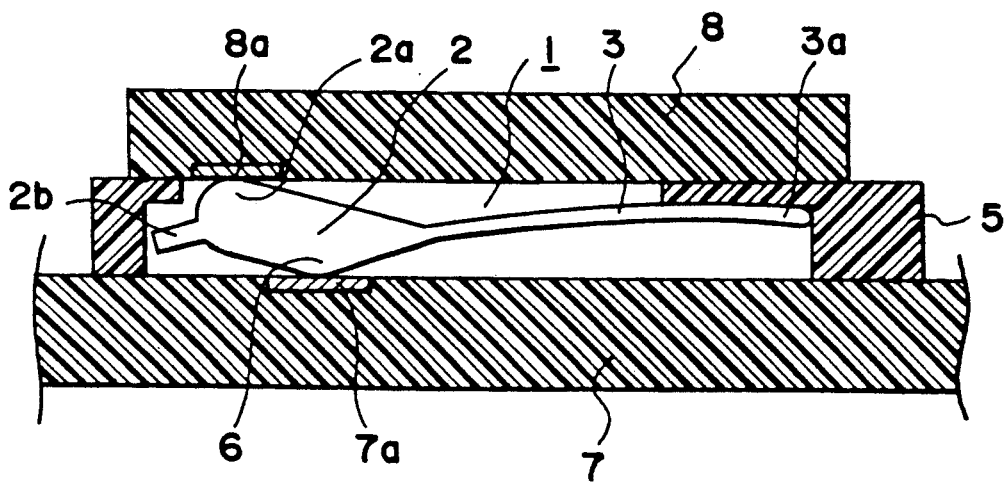

Second Embodiment (see FIG. 2)

In this embodiment, as is shown in FIG. 2(A), the contact 1 is not embedded in the connector base 5 but is interposed between the connector base 5 and the wiring board 7. The tail end 3a of the resilient supporting element 3 forming the contact 1 merely abuts against and is supported by the connector base 5 in such a manner that an upward displacement of the tail end 3a is restricted. The free end of the contact nose 2 is provided with a projecting piece 2b abutted against and supported by the connector base 5 in such a manner that the upward displacement of the projecting piece 2b is restricted. Furthermore, the pressure contact portion formed by the bent portion 6 is abutted against and supported by the conductive member 7a of the wiring board 7. In this way, the contact 1 is disposed in a three-point supported state. With respect to the contact 1 the bending portion 6 serves as a first supporting point, the tail end 3a as a second supporting point and the seat 2a as the pressurizing point. The contact 1 is resiliently displaced by a downward force applied to the pressurizing point at the first and second supporting points.

In this way, as is shown in FIG. 2(B), when pressure is applied to the contact nose 2 owing to the electric part terminal 8a being placed on the seat 2a at the free end of the contact nose 2, the contact nose 2 is displaced downward with the bending portion serving as a supporting point while the supporting element 3 is being resiliently deformed. As a result, there can be pressure contact with the conductive member 7a. At the same time, both conductive members are shorted through the contact nose 2.

Third Embodiment (see FIG. 3)

This embodiment, as shown in FIG. 3(A), employs a connector comprising a contact 1 formed of a displaceable contact element 1A and a stationary contact element 1B. The displaceable contact element 1A is formed of a contact nose 2 for contacting a terminal of an electric part and a resilient supporting element 3 for elastically supporting the contact nose 2. The nose 2 and supporting element 3 are continuously formed with a predetermined angle defined therebetween such that a bent portion 6 is formed which serves as a supporting point about which the supporting element 3 and the contact nose 2 are resiliently displaced. On the other hand, the stationary element 1B is formed of a male terminal 10 embedded in the connector base 5. The embedded end portion of the male terminal 10 is formed of a mounting contact element 10a for abutting against and supporting thereon the bent portion 6 of the displaceable contact element 1A.

The free end of the resilient supporting element 3 forming the contact 1 is abutted against and supported by the connector base 5 in such a manner that an upward displacement of the free end is restricted. The free end of the contact nose 2 is provided with a projecting piece 2b which is abutted against the supported by the connector base 5 in such a manner that the upward displacement of the projecting piece 2b is prevented.

Furthermore, the pressure contact member formed by the bent portion 6 is abutted against and supported by the stationary contact element 1B. In this way, the contact 1 is supported at three points.

When, as is shown in FIG. 3(B), pressure is applied to the mounting contact portion 2a at the free end of the contact nose 2 by the pressure member 9 placing the electric part terminal 8a thereon, the contact nose 2 is displaced downward with the bent portion 6 serving as a supporting point resulting in the resilient deformation of the elastic supporting element 3 providing pressure contact with both the stationary contact element 1B and the terminal element 8a of the electric part 8. At the same time, the elements 1B and 8a are shorted through the contact nose 2.

Fourth Embodiment

In this embodiment the mounting contact element 10a of the stationary contact element 1B of the third embodiment is formed of a resilient piece which is displaced in the pressure applying direction. In this case, the displaceable contact element 1A can be embedded in the connector base 5 through the stationary portion 4 as in the first embodiment.

Also, as still another example, the contact nose 2 of the first through fourth embodiments can be formed of a rigid member such that when the contact nose 2 is displaced pressure contact is provided by the elastic supporting element 3.

As yet another example, the connector of the third and fourth embodiments is employed and the stationary contact elements 1B are arranged in a zigzag form, the male terminals 10 of the adjacent stationary terminals being disposed in positions spaced at equal distances from the bent portions 6. In this way, a high density arrangement is obtained.

According to the conventional contact, resiliency is provided with a U-shaped bypass element and therefore, deterioration of high frequency characteristics is invited and a special short circuit means is required in order to properly cope with such a deterioration. However, according to the present invention, there can be provided a contact of a simple structure which is capable of providing a bypass through the shortest distance while exhibiting favorable resiliency which is required to satisfactorily achieve a mounting contact with the electric part terminal.

That is, the contact nose provides a favorable pressure contact while bending the elastic supporting element as facilitated by the resiliency of the elastic supporting element and at the same time, is capable of effectively providing a bypass through the shortest distance by way of the contact nose. Also, the connector of the present invention is less bulky compared with the conventional connector having the U-shaped bypass element, thus representing a miniaturization of the conventional contact.

As seen in the foregoing, the present invention has been described in several preferred embodiments. It is to be understood, however, the invention is not limited to these embodiments. Many changes and modifications can of course be made without departing from the scope of the present invention.

What is claimed is:

1. An electrical connector comprising a board having an electrically conductive member thereon, a connector base fixed to said board, and an electrically conductive contact fixed relative to said board by said connector base, said contact including a contact nose, and a resilient supporting element extending contiguously from said contact nose with a predetermined angle defined therebetween such that a bent portion of the contact is formed between the contact nose and the supporting element, said contact nose being resiliently displaceable about the bent portion, said bent portion being disposed over the electrically conductive member of said board, and said resilient supporting element having a tail end remote from said bent portion and which tail end is fixed from moving relative to said board by said connector base, whereby when a sufficient downward force is exerted on said contact nose, said resilient supporting element is flexed and said contact nose is resiliently displaced about said bent portion with said bent portion contacting the electrically conductive member of said board under pressure.

2. An electrical connector as claimed in claim 1, wherein said contact nose is a rigid member.

3. An electrical connector comprising a contact base having a stationary electrically conductive contact element embedded therein, and an electrically conductive contact fixed relative to said connector base, said contact including a contact nose, and a resilient supporting element extending contiguously from said contact nose with a predetermined angle defined therebetween such that a bent portion of the contact is formed between the contact nose and the supporting element, said contact nose being resiliently displaceable about the bent portion, said bent portion being disposed over said contact element, and said resilient supporting element having a tail end remote from said bent portion and which tail end is fixed from moving relative to said connector base, whereby when a sufficient downward force is exerted on said contact nose, said resilient supporting element is flexed and said contact nose is resiliently displaced about said bent portion with said bent portion contacting said contact member under pressure.

4. An electrical connector as claimed in claim 3, wherein a plurality of said contact members and said contacts are provided, each of said contact members having a male terminal, the contact members being arranged in a zigzag manner with the male terminals of adjacent ones of the contact member disposed in positions at equal distances from the bent portions of said contacts, respectively.

* * * * *